United States Patent [19]

Shimazaki

[11] Patent Number: 5,633,172
[45] Date of Patent: May 27, 1997

[54] METHOD FOR ANALYING AN IMPURITY ON A SEMICONDUCTOR SUBSTRATE

[75] Inventor: Ayako Shimazaki, Yokohama, Japan

[73] Assignee: Kabushiki Kaisha Toshiba, Kawasaki, Japan

[21] Appl. No.: 350,618

[22] Filed: Dec. 7, 1994

[30] Foreign Application Priority Data

Dec. 9, 1993 [JP] Japan ................... 5-308997

[51] Int. Cl.$^6$ ................... G01N 31/00
[52] U.S. Cl. ................... 436/177; 436/174; 436/5
[58] Field of Search ................... 436/177, 178, 436/174, 5; 156/643.1, 646.1

[56] References Cited

U.S. PATENT DOCUMENTS

| | | | |
|---|---|---|---|
| 3,660,250 | 5/1972 | Duffy et al. | 204/1 T |
| 4,168,212 | 9/1979 | Faktor et al. | 254/1 T |
| 4,180,439 | 12/1979 | Deines et al. | 204/1 T |
| 4,634,497 | 1/1987 | Shimazaki | 156/646.1 |
| 4,990,459 | 2/1991 | Maeda et al. | 436/178 |
| 5,055,413 | 10/1991 | Kageyama et al. | 436/178 |
| 5,252,827 | 10/1993 | Koga et al. | 250/281 |
| 5,385,629 | 1/1995 | Lamberton et al. | 156/626 |
| 5,397,475 | 3/1995 | Millar et al. | 210/661 |

FOREIGN PATENT DOCUMENTS

| | | |
|---|---|---|
| 0137409 | 4/1985 | European Pat. Off. . |
| 3516973 | 2/1986 | Germany . |

OTHER PUBLICATIONS

Patent Abstracts of Japan, Kokai No. 4–225526, vol. 16, No. 574, 1992.

Patent Abstracts of Japan, Kokai No. 2–229428, vol. 14, No. 541, 1990.

Patent Abstracts of Japan, Kokai No. 3–239343, vol. 16, No. 23, 1992.

Patent Abstracts of Japan, Kokai No. 3–004166, vol. 15, No. 115, 1991.

Patent Abstracts of Japan, Kokai No. 5–343494, vol. 18, No. 171, 1994.

*Primary Examiner*—James C. Housel
*Assistant Examiner*—Rachel Heather Freed
*Attorney, Agent, or Firm*—Finnegan, Henderson, Farabow, Garrett & Dunner, L.L.P.

[57] ABSTRACT

A method is provided for analyzing an impurity on a semiconductor substrate. In this method, those to-be-measured areas on a surface of a semiconductor substrate are exposed with an ultraviolet radiation to provide corresponding oxide films. By doing so, an impurity is trapped in the oxide film at each area of the semiconductor substrate. The surface of the semiconductor substrate is cleaned with an acid solution to remove an impurity on other than the areas on the surface of the semiconductor substrate. The surface of the semiconductor substrate is exposed with a hydrofluoric acid vapor to dissolve the oxide films into very fine droplets containing an impurity. These droplets are moved on the surface of the semiconductor substrate to collect these droplets into a drop on the surface of the semiconductor substrate. The impurity in the drop is measured by a known chemical spectrometer.

90 Claims, 3 Drawing Sheets

METHOD FOR ANALYING AN IMPURITY ON A SEMICONDUCTOR SUBSTRATE

BACKGROUND OF THE INVENTION

1. Field of the Invention

The present invention relates to a method for analyzing an impurity present on the surface of a semiconductor substrate and, in particular, to a method for measuring an amount of impurity on a semiconductor substrate surface at those local areas of a repeated pattern.

2. Description of the Related Art

It has been known that a metal impurity is present on the surface of a semiconductor substrate or a semiconductor wafer and that the metal impurity, even if being very small in amounts, adversely affects the electric characteristics of a device. With a recent tendency toward realizing a high-density device, more and more exacting demand is made for the analysis of an impurity. There is also a high demand for the high-accurate analytical technique.

In the conventional analytical method, a solution for impurity collection, such as an acid solution, is dropped on a whole surface area of a semiconductor substrate or on a nearly liquid-drop-size area on the surface of a semiconductor substrate where an impurity is collected. Then an amount of impurity collected in that solution used is measured by a chemical analytic apparatus such as a flameless atomic absorption apparatus.

It has been known by an accelerated test that, on a semiconductor substrate having a surface pattern similar to a device surface pattern, the surface distribution pattern of an impurity concentration depends upon the surface pattern of the semiconductor substrate. The device surface pattern has become very small with the microminiaturization of the semiconductor element so that the surface distribution pattern of take impurity concentration becomes very small. Recently, the surface pattern of the device is of the order of a micron or submicron.

On the other hand, the surface resolution by the conventional analytical method is of the order of a few $cm^2$, an ordinary size of to-be-collected liquid drops at best, thus failing to achieve high-accurate analysis.

SUMMARY OF THE INVENTION

It is accordingly the object of the present invention to provide a method capable of accurately analyzing an amount of impurity on the surface of a semiconductor substrate.

According to one aspect of the present invention, a method is provided for analyzing an impurity on the surface of a semiconductor substrate, comprising the steps of:

- oxidizing those to-be-measured areas on a surface of a semiconductor substrate to provide corresponding oxide films and trapping an impurity in the oxide film at each area of the semiconductor substrate;
- removing an impurity from other than the areas on the surface of the semiconductor substrate;
- dissolving the oxide films on the to-be-measured areas into droplets;
- collecting the droplets into a drop; and
- measuring an amount of impurity in the drop.

According to another aspect of the present invention, a method is provided for analyzing an impurity on a semiconductor substrate, comprising the steps of:

- depositing nitride films on those to-be-measured areas on a surface of a semiconductor substrate and trapping an impurity in the nitride film at each area of the semiconductor substrate;
- removing an impurity from other than the areas on the surface of the semiconductor substrate;
- dissolving the nitride films on the to-be-measured areas into droplets;
- collecting the droplets into a drop; and
- measuring an amount of impurity in the drop.

According to a further aspect of the present invention, a method is provided for analyzing an impurity on a semiconductor substrate, comprising the steps of:

- oxidizing those to-be-measured areas on a surface of a semiconductor substrate to provide corresponding oxide films and trapping an impurity in the oxide film at each area of the semiconductor substrate;
- removing an impurity from other than the areas on the surface of the semiconductor substrate;
- dissolving the oxide films on the to-be-measured areas into droplets;
- collecting the droplets into a drop;
- measuring an amount of impurity in the drop;
- repeating the oxidizing step through the measuring step; and
- plotting the amount of impurity obtained at each measuring step in a depth direction of the semiconductor substrate.

According to a still further aspect of the present invention, a method is provided for analyzing an impurity on a semiconductor substrate, comprising the steps of:

- depositing nitride films on those to-be-measured areas on a surface of a semiconductor substrate and trapping an impurity in the nitride film at each area of the semiconductor substrate;
- removing an impurity from other than the areas on the surface of the semiconductor substrate;
- dissolving the nitride films on the to-be-measured areas into droplets;
- collecting the droplets into a drop;
- measuring an amount of impurity in the drop;
- repeating the nitride film depositing step through the measuring step; and
- plotting the amount of impurity obtained at each measuring step in a depth direction of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The present invention will be explained below with reference to the accompanying drawings.

Figure 1:
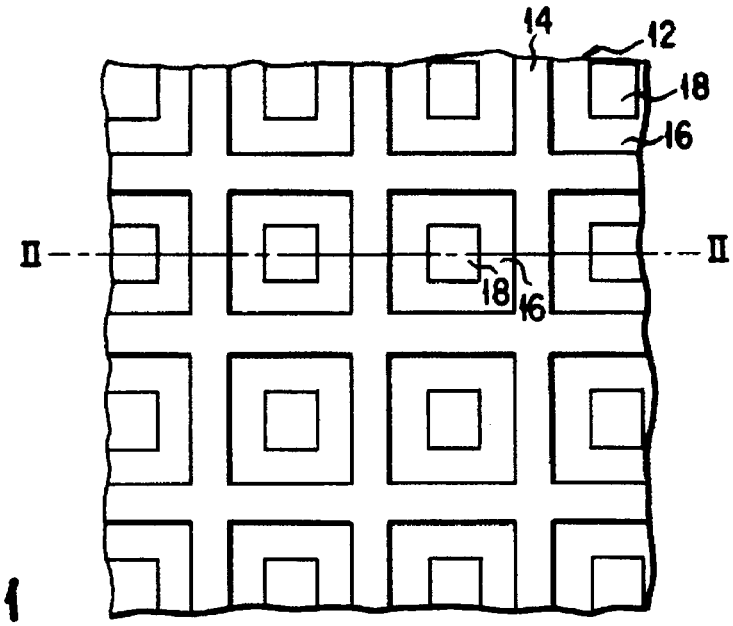
FIG. 1 is a view showing a model showing a surface pattern on a semiconductor substrate.
Figure 2:
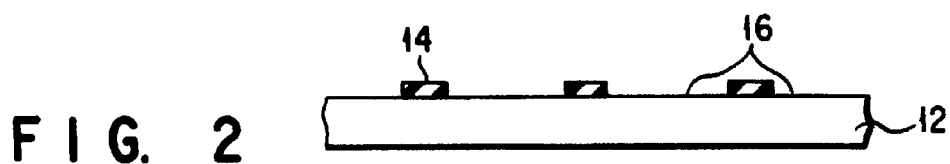
FIG. 2 is a cross-sectional view, taken along line II—II in FIG. 1.

FIG. 1 shows a model of a surface pattern on a semiconductor silicon substrate. A surface pattern layer 14 is formed of, for example, an insulating layer for semiconductor element isolation, providing a repeated pattern. Semiconductor element areas 16 are each formed by a semiconductor substrate surface area bounded by the isolation layer 14. In this embodiment, a respective local area 18 to be measured constitutes a portion of each element area, that is, those local areas 18 constitute mutually corresponding areas on the repeated pattern. FIG. 2 is a cross-sectional view, taken along line II—II in FIG. 1. In FIGS. 3A to 3D, the insulating pattern 14 for isolation is omitted for brevity's sake.

The analytical examination is made by the following way.

Figure 3A:
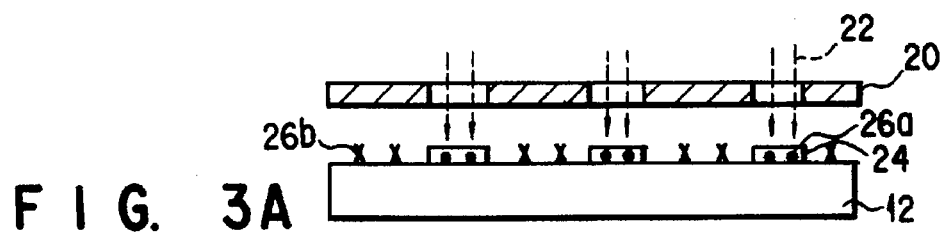
FIGS. 3A to 3D show the steps of a method for analyzing an amount of impurity on the surface of a semiconductor substrate in accordance with one example of the present invention, a view mainly showing a layer variation on the substrate surface.

As shown in FIG. 3A, an ultraviolet radiation 22 is directed with a given pattern as a mask to those to-be-measured local areas 18 on the surface of a semiconductor silicon substrate 12 in a clean oxygen atmosphere. In FIG. 3A, an insulating layer pattern 14 for isolation is omitted for the sake of simplification.

Then only the local area 18 irradiated with the ultraviolet radiation is oxidized by a heating process to form an oxide film 24, as a few nm-thick $SiO_2$ film, only on the areas to be measured. By doing so, an impurity 26a in the area on the substrate surface is trapped in the oxide film 24.

Figure 3B:
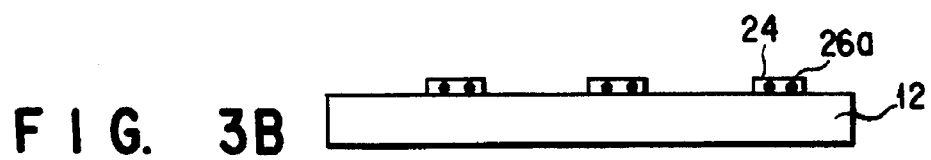

The surface of the semiconductor substrate 12 is cleaned with a suitable detergent, such as an acid solution consisting of, for example, a hydrochloric acid/hydrogen peroxide-mixed aqueous solution. As shown in FIG. 3B, an impurity on other than the to-be-treated area on the surface of the semiconductor substrate is removed.

Figure 3C:
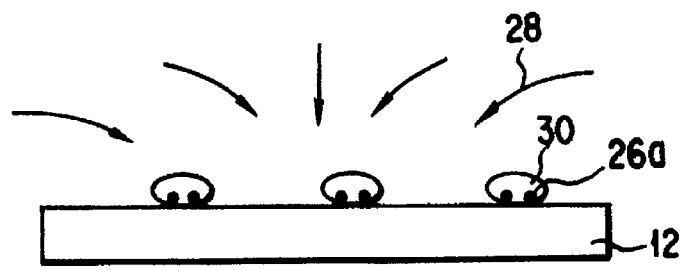

Thereafter, the resultant semiconductor substrate surface 12 is exposed with, for example, a hydrofluoric acid vapor to dissolve the oxide film 24, so that, as shown in FIG. 3C, very fine droplets (impurity drops) 30 containing the impurity are left on the surface of the substrate 12.

Figure 3D:
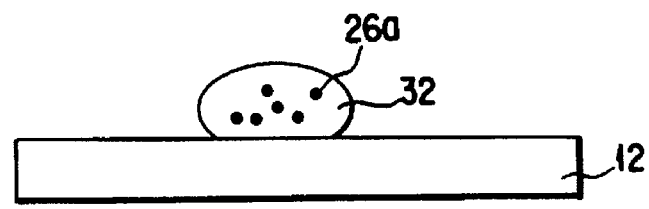

About 100 to 500 μl of a liquid is dropped to the semiconductor substrate 12 and the very fine droplets (impurity collecting drops) are moved on the semiconductor substrate like in a scanning way to collect fine droplets 30 on the substrate surface and hence to provide a gathered drop 32 as shown in FIG. 3D. The liquid may be water, preferably, a high-purity acid solution consisting of, for example, a hydrochloric acid/hydrogen peroxide aqueous solution.

Then an amount of impurity 26a in the gathered drop is measured by a known chemical spectrometer, such as a flameless atomic absorption spectrometer and inductively coupled plasma mass spectrometer. From the measured amount it is possible to calculate the concentration level of the impurity per unit area of the area to be measured. Any other measuring device may be used in place of the chemical spectrometer.

As evident from the embodiment, it is possible according to the present invention to achieve a high surface resolution and hence to measure, with high accuracy, an amount of impurity 26a in the local areas 18 on the semiconductor substrate 12. In other words it it possible to highly accurately obtain the distribution characteristic from the amount of impurity on the surface of the semiconductor substrate 12. Although, according to the present invention, the local areas on the substrate surface correspond to a regularly repeated pattern array on the semiconductor surface 12, the present invention is not restricted thereto and it is also possible to measure a single local area 16 or any plurality of local areas.

The sensitivity of the present method under the chemical analysis, depending upon the size or area of the local area to be measured, is of the order of $10^9$ to $10^{10}$ atoms/cm$^2$, a very high value than an ordinary sensitivity under a physical analysis of the order of $10^{13}$ to $10^{14}$ atoms/cm$^2$. Even the impurity distribution characteristic of a pattern as small as a micron or submicron order under the pattern rule of a recent device can be obtained with high accuracy.

In the above embodiment, the position of the surface portion of the semiconductor substrate 12 at which the oxide film 24 has been dissolved, is lowered in the depth direction of the semiconductor substrate 12. Therefore, after the step of collecting the very fine droplets 30, an insulating film is formed on those local areas, to be measured, on the resultant semiconductor substrate structure by the application of an ultraviolet radiation with the above-mentioned mask again used and, by doing so repetitively, a corresponding distribution characteristic is formed, each time, relative to the amount of impurity, so that amount-of-impurity distribution characteristics can be gained at different positions in a depth direction of the semiconductor structure, that is, it is possible to obtain amount-of-impurity distribution characteristics in the depth of the semiconductor structure by plotting these distribution characteristics in that depth direction.

In the case where an impurity-free epitaxial layer is formed on a semiconductor wafer (semiconductor substrate), if those selected areas on the surface of the epitaxial layer are those spots to be measured, it is possible to, upon the formation of an oxide film, suppress the entry of an impurity from the semiconductor wafer into the oxide film. Therefore, those droplets collected contain only that impurity trapped in the epitaxial layer surface and more accurate analytic examination can be made for a metal impurity, such as Fe and Na, present on the surface of the semiconductor substrate.

Figure 4A:
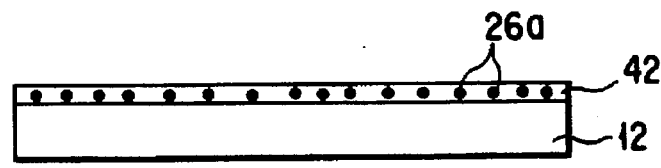
FIGS. 4A to 4D show initial steps of a method for analyzing an amount of impurity on the surface of a semiconductor substrate in accordance with another example of the present invention.
Figure 4B:
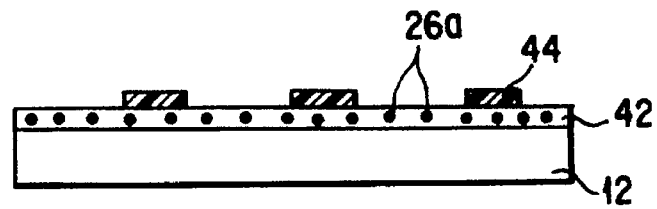
Figure 4C:
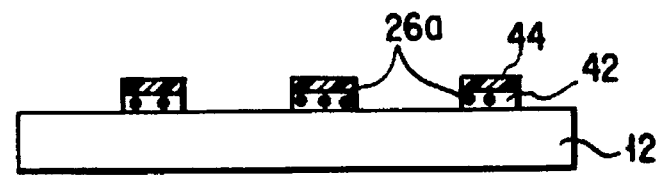
Figure 4D:
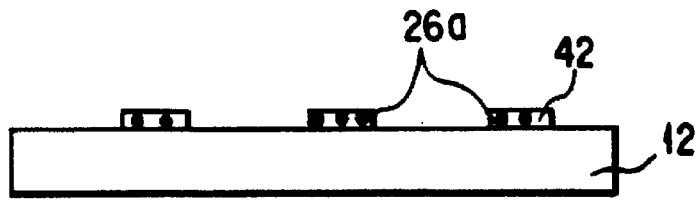

Although, in the above-mentioned embodiment, the oxide film 24 has been explained as being formed by an irradiation with the ultraviolet radiation and hence application of heat, it may be possible to utilize the exposure and hence heating of, for example, a laser beam. The formation of the oxide film 24 is not restricted only to the exposure of light. For example, an SiN film or $SiO_2$ film 42 is formed, by a known chemical vapor deposition method, on the whole surface of a semiconductor silicon substrate 12 as shown in FIG. 4A and a photoresist layer 44 whose pattern is an inverted version of a pattern for those to-be-measured areas on the semiconductor substrate is formed by a known method on the $SiO_2$ film 42 as shown in FIG. 4B. Then only those $SiO_2$ film 42 portions on these areas are left, by a selective etching, on the semiconductor substrate 12 with the photoresist layer 44 used as a mask as shown in FIG. 4C, followed by the elimination of the photoresist layer 44. By doing so it may be possible to obtain those SiN or $SiO_2$ film 42 portions as shown in FIG. 4D.

Figure 5A:
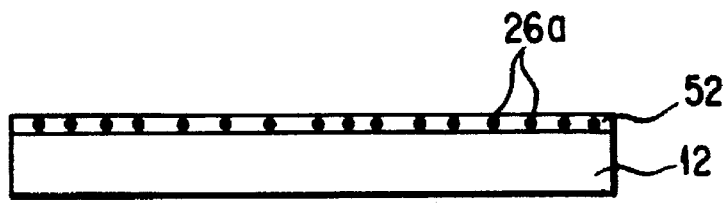
FIGS. 5A to 5D show initial steps of a method for analyzing an amount of impurity on the surface of a semiconductor substrate in accordance with another example of the present invention.
Figure 5B:
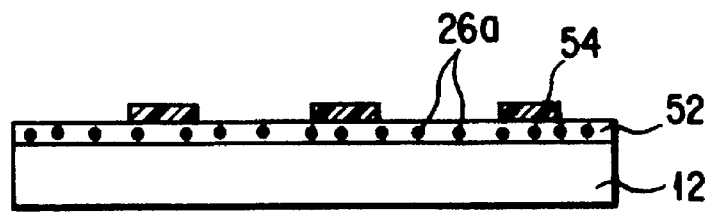
Figure 5C:
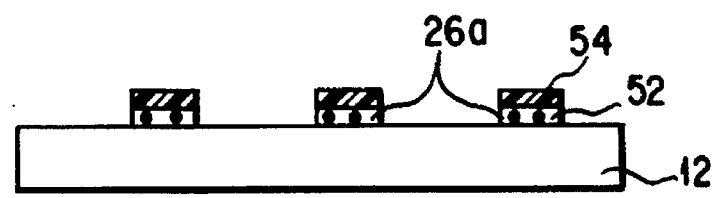
Figure 5D:
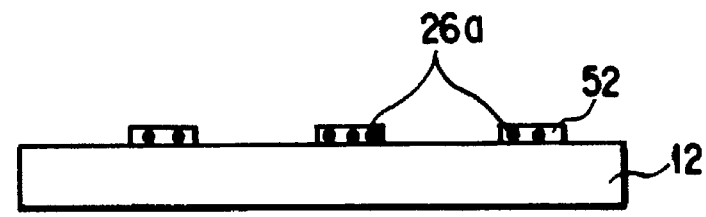

The oxide film 42 may be replaced with a nitride film. Forming the nitride film can be achieved in substantially the same way as in the case where the $SiO_2$ film 42 is formed on the substrate as shown in FIGS. 4A to 4D. That is, an SiN film 52 is formed, by a known chemical vapor deposition method, on the whole surface of a semiconductor silicon substrate 12 as shown in FIG. 5A and a photoresist layer 54 whose pattern is an inverted version of a pattern for those to-be-measured areas on a semiconductor substrate 12 is formed, by a known method, on the SiN film 52 as shown in FIG. 5B. Then the surface of the resultant semiconductor structure is selectively etched with a photoresist layer 54 used as a mask to leave only those to-be-measured areas of the SiN film 52 on the surface of the semiconductor device as shown in FIG. 5C, followed by the elimination of the photoresist layer 54 as shown in FIG. 5D. The remaining processing steps are the same as those using the $SiO_2$ film set out in conjunction with FIGS. 3A to 3D.

As evident from the above explanation, according to the present method, it is possible to realize a high surface resolution. It is possible to highly accurately measure an amount of impurity on local areas on the semiconductor substrate 12 and hence to highly accurately obtain a distribution characteristic relating to an amount of impurity on the surface of a semiconductor substrate 12.

Additional advantages and modifications will readily occur to those skilled in the art. Therefore, the invention in its broader aspects is not limited to the specific details and illustrated examples shown and described herein. Accordingly, various modifications may be made without departing from the spirit or scope of the general inventive concept as defined by the appended claims and their equivalents.

What is claimed is:

1. A method for analyzing an impurity on a semiconductor substrate, comprising the steps of:

forming oxide films on one or more to-be-measured areas on a surface of a semiconductor substrate and trapping an impurity in the oxide film at each to-be-measured area of the semiconductor substrate, and wherein the to-be-measured areas are independent and distinct from each other;

removing an impurity from other than the to-be-measured areas on the surface of the semiconductor substrate;

dissolving the oxide films on the to-be-measured areas into droplets;

collecting the droplets into a drop; and measuring an amount of impurity in the drop.

2. The method according to claim 1, wherein the to-be-measured areas are a plurality of local areas on the semiconductor substrate.

3. The method according to claim 1, wherein the to-be-measured areas are repeated areas corresponding to a repeated pattern on the surface of the semiconductor substrate.

4. The method according to claim 1, wherein the oxide film is formed on the to-be-measured areas by emitting an ultraviolet radiation on these areas to apply heat there.

5. The method according to claim 1, wherein the oxide film is formed on the to-be-measured areas by emitting a laser beam on these areas to apply heat there.

6. The method according to claim 1, wherein the oxide films are obtained by forming an oxide film on a whole surface of the semiconductor substrate, forming a mask layer of a given pattern on the oxide film on the whole surface and selectively etching the oxide film with the mask layer used as a mask to leave only the oxide film on the to-be-measured areas.

7. The method according to claim 1, wherein the removal of the impurity is effected by washing the surface of the semiconductor substrate with an acid solution.

8. The method according to claim 7, wherein the acid solution consists of a hydrochloric acid/hydrogen peroxide-mixed aqueous solution.

9. The method according to claim 1, wherein the oxide film is dissolved by exposing the surface of the semiconductor substrate to a hydrofluoric acid vapor.

10. The method according to claim 1, wherein the collection of the droplets is effected by moving an acid solution on the surface of the semiconductor substrate in a scanning way.

11. The method according to claim 10, wherein the acid solution consists of a hydrochloric acid/hydrogen peroxide-mixed aqueous solution.

12. The method according to claim 1, wherein the amount of impurity is measured by a chemical analysis.

13. The method according to claim 12, wherein the chemical analysis is made by a flameless atomic absorption spectrometer.

14. The method according to claim 12, wherein the chemical analysis is made by an inductive coupled plasma mass spectrometer.

15. A method for analyzing an impurity on a semiconductor substrate, comprising the steps of:

forming nitride films on one or more to-be-measured areas on a surface of a semiconductor substrate and trapping an impurity in the nitride film at each to-be-measured area of the semiconductor substrate; and wherein the to-be-measured areas are independent and distinct from each other;

removing an impurity from other than the to-be-measured areas on the surface of the semiconductor substrate;

dissolving the nitride films on the to-be-measured areas into droplets;

collecting the droplets into a drop; and measuring an amount of impurity in the drop.

16. The method according to claim 15, wherein the to-be-measured areas are a plurality of selected areas on the semiconductor substrate.

17. The method according to claim 15, wherein the to-be-measured areas are repeated areas corresponding to a repeated pattern on the surface of the semiconductor substrate.

18. The method according to claim 15, wherein the nitride films are obtained by forming a nitride film on a whole surface of the semiconductor substrate, forming a mask layer of a given pattern on the nitride film on the whole surface and selectively etching the nitride film with the mask layer used as a mask to leave only the nitride film on the to-be-measured areas.

19. The method according to claim 15, wherein the removal of the impurity is effected by washing the surface of the semiconductor substrate with an acid solution.

20. The method according to claim 19, wherein the acid solution consists of a hydrochloric acid/hydrogen peroxide-mixed aqueous solution.

21. The method according to claim 15, wherein the nitride film is dissolved by exposing the surface of the semiconductor substrate to a hydrofluoric acid vapor.

22. The method according to claim 15, wherein the collection of the droplets is effected by moving an acid solution on the surface of the semiconductor substrate in a scanning way.

23. The method according to claim 22, wherein the acid solution consists of a hydrochloric acid/hydrogen peroxide-mixed aqueous solution.

24. The method according to claim 15, wherein the amount of impurity is measured by a chemical analysis.

25. The method according to claim 24, wherein the chemical analysis is made by a flameless atomic absorption spectrometer.

26. The method according to claim 24, wherein the chemical analysis is made by an inductive coupled plasma mass spectrometer.

27. A method for analyzing an impurity on a semiconductor substrate, comprising the steps of:

forming oxide films on one or more to-be-measured areas on a surface of a semiconductor substrate and trapping an impurity in the oxide film at each to-be-measured area of the semiconductor substrate, and wherein the to-be-measured areas are independent and distinct from each other;

removing an impurity from other than the to-be-measured areas on the surface of the semiconductor substrate;

dissolving the oxide films on the to-be-measured areas into droplets;

collecting the droplets into a drop;

measuring an amount of impurity in the drop;

repeating said oxidizing step through said measuring step; and plotting the amount of impurity obtained at each measuring step in a depth direction of said semiconductor substrate.

28. The method according to claim 27, wherein the to-be-measured areas are a plurality of selected areas on the semiconductor substrate.

29. The method according to claim 27, wherein the to-be-measured areas are repeated areas corresponding to a repeated pattern on the surface of the semiconductor substrate.

30. The method according to claim 27, wherein the oxide film is formed on the to-be-measured areas by emitting an ultraviolet radiation on these areas to apply heat there.

31. The method according to claim 27, wherein the oxide film is formed on the to-be-measured areas by emitting a laser beam on these areas to apply heat there.

32. The method according to claim 27, wherein the oxide films are obtained by forming an oxide film on a whole surface of the semiconductor substrate, forming a mask layer of a given pattern on the oxide film on the whole surface and selectively etching the oxide film with the mask layer used as a mask to leave only the oxide film on the to-be-measured areas.

33. The method according to claim 27, wherein the removal of the impurity is effected by washing the surface of the semiconductor substrate with an acid solution.

34. The method according to claim 33, wherein the acid solution consists of a hydrochloric acid/hydrogen peroxide-mixed aqueous solution.

35. The method according to claim 27, wherein the oxide film is dissolved by exposing the surface of the semiconductor substrate to a hydrofluoric acid vapor.

36. The method according to claim 27, wherein the collection of the droplets is effected by moving an acid solution on the surface of the semiconductor substrate in a scanning way.

37. The method according to claim 36, wherein the acid solution consists of a hydrochloric acid/hydrogen peroxide-mixed aqueous solution.

38. The method according to claim 27, wherein the amount of impurity is measured by a chemical analysis.

39. The method according to claim 38, wherein the chemical analysis is made by a flameless atomic absorption spectrometer.

40. The method according to claim 38, wherein the chemical analysis is made by an inductive coupled plasma mass spectrometer.

41. A method for analyzing an impurity on a semiconductor substrate, comprising the steps of:

forming nitride films on one or more to-be-measured areas on a surface of a semiconductor substrate and trapping an impurity in the nitride film at each to-be-measured area of the semiconductor substrate, and wherein the to-be-measured areas are independent and distinct from each other;

removing an impurity from other than the to-be-measured areas on the surface of the semiconductor substrate, dissolving the nitride films on the to-be-measured areas into droplets;

collecting the droplets into a drop;

measuring an amount of impurity in the drop;

repeating said nitride film depositing step through said measuring step; and plotting the amount of impurity obtained at each measuring step in a depth direction of said semiconductor substrate.

42. The method according to claim 15, wherein the collection of the droplets are effected by moving water in a scan way.

43. The method according to claim 27, wherein the collection of the droplets are effected by moving water in a scan way.

44. The method according to claim 41, wherein the collection of the droplets are effected by moving water in a scan way.

45. The method according to claim 6, wherein the oxide film on the whole surface of the semiconductor substrate is formed by a chemical-vapor-deposition method.

46. The method according to claim 18, wherein the nitride film on the whole surface of the semiconductor substrate is formed by a chemical-vapor-deposition method.

47. The method according to claim 32, wherein the oxide film on the whole surface of the semiconductor substrate is formed by a chemical-vapor-deposition method.

48. The method according to claim 15, wherein the nitride film on the whole surface of the semiconductor substrate is formed by a chemical-vapor-deposition method.

49. A method for analyzing an impurity on a semiconductor substrate having a first surface area and a second surface area, comprising the steps of:

forming films on to-be-measured areas constituting the first surface area on a surface of the semiconductor substrate and trapping an impurity in the films at the first surface area of the semiconductor substrate, and wherein the to-be-measured areas are independent and distinct from each other;

removing an impurity from the second surface area which are other than the first surface area on the surface of the semiconductor substrate;

dissolving the films on the to-be-measured areas into droplets;

collecting the droplets into a drop; and measuring an amount of impurity in the drop.

50. The method according to claim 49, wherein the to-be-measured areas are a plurality of areas on the semiconductor substrate.

51. The method according to claim 49, wherein the to-be-measured areas are repeated areas corresponding to a repeated pattern on the surface of the semiconductor substrate.

52. The method according to claim 49, wherein the removal of the impurity is effected by washing the surface of the semiconductor substrate with an acid solution.

53. The method according to claim 52, wherein the acid solution consists of a hydrochloric acid/hydrogen peroxide-mixed aqueous solution.

54. The method according to claim 49, wherein the films are dissolved by exposing the surface of the semiconductor substrate to a hydrofluoric acid vapor.

55. The method according to claim 49, wherein the collection of the droplets are effected by moving an acid solution on the surface of the semiconductor substrate in a scanning way.

56. The method according to claim 54, wherein the acid solution consists of a hydrochloric acid/hydrogen peroxide-mixed aqueous solution.

57. The method according to claim 49, wherein the amount of impurity is measured by a chemical analysis.

58. The method according to claim 57, wherein the chemical analysis is made by a flameless atomic absorption spectrometer.

59. The method according to claim 57, wherein the chemical analysis is made by an inductive coupled plasma mass spectrometer.

60. A method for analyzing an impurity on a semiconductor substrate having a first surface area and a second surface area, comprising the steps of:

forming a film on a to-be-measured area constituting a first surface area on a surface of the semiconductor substrate and trapping an impurity in the film at the first surface area of the semiconductor substrate, and wherein the to-be-measured area are independent and distinct from each other;

removing an impurity from the second surface area which is other than the first surface area on the surface of the semiconductor substrate;

dissolving the film on the to-be-measured area into a droplet;

collecting the droplet; and measuring an amount of impurity in the droplet.

61. The method according to claim 60, wherein the to-be-measured area is an area on the semiconductor substrate.

62. The method according to claim 60, wherein the removal of the impurity is effected by washing the surface of the semiconductor substrate with an acid solution.

63. The method according to claim 62, wherein the acid solution consists of a hydrochloric acid/hydrogen peroxide-mixed aqueous solution.

64. The method according to claim 60, wherein the oxide film is dissolved by exposing the surface of the semiconductor substrate to a hydrofluoric acid vapor.

65. The method according to claim 60, wherein the collection of the droplets are effected by moving an acid solution on the surface of the semiconductor substrate in a scanning way.

66. The method according to claim 65, wherein the acid solution consists of a hydrochloric acid/hydrogen peroxide-mixed aqueous solution.

67. The method according to claim 60, wherein the amount of impurity is measured by a chemical analysis.

68. The method according to claim 67, wherein the chemical analysis is made by a flameless atomic absorption spectrometer.

69. The method according to claim 67, wherin the chemical analysis is made by an inductive coupled plasma mass spectrometer.

70. A method for analyzing an impurity on a semiconductor substrate having first surface areas and second surface areas, comprising the steps of:

forming films on to-be-measured areas constituting first surface areas on a surface of a semiconductor substrate and trapping an impurity in the film at each first surface area of the semiconductor substrate, and wherein the to-be-measured areas are independent and distinct from each other;

removing an impurity from other than the first surface areas on the surface of the semiconductor substrate;

dissolving the films on the to-be-measured areas into droplets;

collecting the droplets into a drop;

measuring an amount of impurity in the drop;

repeating said film-forming step through said measuring step; and plotting the amount of impurity obtained at each measuring step in a depth direction of said semiconductor substrate.

71. The method according to claim 70, wherein the to-be-measured areas are a plurality of areas on the semiconductor substrate.

72. The method according to claim 70, wherein the to-be-measured areas are repeated areas corresponding to a repeated pattern on the surface of the semiconductor substrate.

73. The method according to claim 70, wherein the removal of the impurity is effected by washing the surface of the semiconductor substrate with an acid solution.

74. The method according to claim 73, wherein the acid solution consists of a hydrochloric acid/hydrogen peroxide-mixed aqueous solution.

75. The method according to claim 70, wherein the oxide film is dissolved by exposing the surface of the semiconductor substrate to hydrofluoric acid vapor.

76. The method according to claim 70, wherein the collection of the droplets are effected by moving an acid solution on the surface of the semiconductor substrate in a scanning way.

77. The method according to claim 76, wherein the acid solution consists of a hydrochloric acid/hydrogen peroxide-mixed aqueous solution.

78. The method according to claim 70, wherein the amount of impurity is measured by a chemical analysis.

79. The method according to claim 78, wherein the chemical analysis is made by a flameless atomic absorption spectrometer.

80. The method according to claim 78, wherein the chemical analysis is made by an inductive coupled plasma mass spectrometer.

81. A method for analyzing an impurity on a semiconductor substrate having a first surface area and a second surface area, comprising the steps of:

forming an oxide film on to-be-measured areas constituting a first surface area on a surface of a semiconductor substrate and trapping an impurity in the oxide film at the first surface area of the semiconductor substrate, and wherein the to-be-measured areas are independent and distinct from each other;

removing an impurity from a second surface area which is other than the first surface area on the surface of the semiconductor substrate;

dissolving the oxide film on the to-be-measured area into a droplet;

collecting the droplet;

measuring an amount of impurity in the droplet;

repeating said film forming step through said measuring step; and plotting the amount of impurity obtained at each measuring step in a depth direction of said semiconductor substrate.

82. The method according to claim 81, wherein the to-be-measured area is an area on the semiconductor substrate.

83. The method according to claim 81, wherein the removal of the impurity is effected by washing the surface of the semiconductor substrate with an acid solution.

84. The method according to claim 83, wherein the acid solution Consists of a hydrochloric acid/hydrogen peroxide-mixed aqueous solution.

85. The method according to claim 81, wherein the oxide film is dissolved by exposing the surface of the semiconductor substrate to hydrofluoric acid vapor.

86. The method according to claim 81, wherein the collection of the droplets are effected by moving an acid solution on the surface of the semiconductor substrate in a scanning way.

87. The method according to claim 86, wherein the acid solution consists of a hydrochloric acid/hydrogen peroxide-mixed aqueous solution.

88. The method according to claim 81, wherein the amount of impurity is measured by a chemical analysis.

89. The method according to claim 88, wherein the chemical analysis is made by a flameless atomic absorption spectrometer.

90. The method according to claim 88, wherein the chemical analysis is made by an inductive coupled plasma mass spectrometer.

* * * * *

UNITED STATES PATENT AND TRADEMARK OFFICE
CERTIFICATE OF CORRECTION

PATENT NO. : 5,633,172
DATED : May 27, 1997
INVENTOR(S) : Ayako SHIMAZAKI

It is certified that error appears in the above-indentified patent and that said Letters Patent is hereby corrected as shown below:

Claim 60, column 9, line 40, "to-be-measured area" should read --to be measured areas--.

Claim 84, column 12, line 2, "Consists" should read --consists--.

Signed and Sealed this

Third Day of March, 1998

*Attest:*

BRUCE LEHMAN

*Attesting Officer*     *Commissioner of Patents and Trademarks*